(12) United States Patent
Andersen et al.

(10) Patent No.: US 7,738,613 B1
(45) Date of Patent: Jun. 15, 2010

(54) STREAMING MULTI-CHANNEL AUDIO AS PACKETIZED DATA OR PARALLEL DATA WITH A SEPARATE INPUT FRAME SYNC

(75) Inventors: Jack B. Andersen, Austin, TX (US); Joel W. Page, Austin, TX (US); Daniel L. W. Chieng, Austin, TX (US); Douglas D. Gephardt, Dripping Springs, TX (US)

(73) Assignee: D2Audio Corporation, Milpitas, CA (US)

( * ) Notice: Subject to any disclaimer, the term of this patent is extended or adjusted under 35 U.S.C. 154(b) by 1571 days.

(21) Appl. No.: 10/805,574

(22) Filed: Mar. 20, 2004

Related U.S. Application Data (60) Provisional application No. 60/469,804, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H04L 7/00* (2006.01)
(52) U.S. Cl. .................. 375/355; 375/220; 375/238; 375/247; 375/356; 375/364
(58) Field of Classification Search ............ 375/224, 375/225, 286, 293, 295, 296, 297, 316, 354, 375/355, 357, 362, 364, 365, 366, 220, 238, 375/247, 356; 348/500, 512, 515, 384.1, 348/390.1, 423.1; 370/503, 510, 520
See application file for complete search history.

(56) References Cited

U.S. PATENT DOCUMENTS 4,184,047 A * 1/1980 Langford .................. 381/63

(Continued)

FOREIGN PATENT DOCUMENTS

| GB | 2 267 193 | 11/1993 |
|---|---|---|
| JP | 2002-314429 | 10/2002 |
| JP | 2008-018518 | 1/2008 |

OTHER PUBLICATIONS

Park, et al., "A Novel Structure for Real-Time Digital Sample-Rate Converters with Finite Precision Error Analysis," Speech Processing 2, VLSI, Underwater Signal Processing, Toronto, May 14-17, 1991, International Conference on Acoustics, Speech and Signal Processing, ICASSP, NY, IEEE, US, vol. 2, Conf. 16, Apr. 14, 1991, 4 pages.
Preliminary amendment in connection with co-pending U.S. Appl. No. 12/359,021, filed Jan. 23, 2009, 7 pages.

*Primary Examiner*—Shuwang Liu
*Assistant Examiner*—Kabir A Timory
(74) *Attorney, Agent, or Firm*—Fliesler Meyer LLP (57) ABSTRACT

Systems and methods for converting a data stream from a first sample rate to a second sample rate, where the data is received in bursts. In one embodiment, a method includes receiving bursty audio data on a first input line and receiving synchronization data on a second input line that is separate from the first input line. An input sample rate is then estimated for the received audio data based on the received synchronization data and the audio data is converted to an output sample rate. The input sample rate is determined by counting samples received in a time interval and potentially low-pass filtering the result. The audio data may be in packetized, parallel, or other forms, and the synchronization data may include individual signals, such as pulses or bits received at regular or irregular intervals.

20 Claims, 5 Drawing Sheets

U.S. PATENT DOCUMENTS

| | | | |
|---|---|---|---|
| 4,641,326 A | 2/1987 | Tomisawa | |
| 4,727,505 A | 2/1988 | Konishi et al. | |
| 4,841,828 A | 6/1989 | Suzuki | |
| 5,023,825 A | 6/1991 | Luthra et al. | |
| 5,285,263 A | 2/1994 | Fujita | |
| 5,319,584 A | 6/1994 | Ooyabu | |
| 5,367,162 A | 11/1994 | Holland et al. | |
| 5,471,411 A | 11/1995 | Adams et al. | |
| 5,475,628 A | 12/1995 | Adams et al. | |
| 5,481,568 A | 1/1996 | Yada | |
| 5,621,805 A | 4/1997 | Loh et al. | |
| 5,648,922 A | 7/1997 | Han | |
| 5,729,227 A * | 3/1998 | Park | 341/100 |
| 5,907,295 A | 5/1999 | Lin | |
| 5,928,313 A | 7/1999 | Thompson | |
| 5,986,589 A | 11/1999 | Rosefield et al. | |
| 6,044,113 A | 3/2000 | Oltean | |
| 6,057,789 A | 5/2000 | Lin | |
| 6,061,410 A | 5/2000 | Linz | |
| 6,124,895 A | 9/2000 | Fielder | |
| 6,134,268 A | 10/2000 | McCoy | |
| 6,208,671 B1 * | 3/2001 | Paulos et al. | 370/545 |
| 6,324,235 B1 | 11/2001 | Savell et al. | |
| 6,393,198 B1 | 5/2002 | LaMacchia | |
| 6,411,333 B1 | 6/2002 | Auld et al. | |
| 6,531,970 B2 | 3/2003 | McLaughlin et al. | |
| 6,593,807 B2 | 7/2003 | Groves et al. | |
| 6,665,338 B1 | 12/2003 | Midya et al. | |
| 6,765,931 B1 | 7/2004 | Rabenko et al. | |
| 6,782,239 B2 * | 8/2004 | Johnson et al. | 455/42 |
| 6,801,922 B2 | 10/2004 | Goszewski et al. | |
| 6,819,732 B1 | 11/2004 | Savell | |
| 6,870,876 B1 * | 3/2005 | Nohlgren et al. | 375/220 |
| 6,970,896 B2 | 11/2005 | Awad et al. | |
| 7,012,650 B2 * | 3/2006 | Hu et al. | 348/515 |
| 7,023,868 B2 | 4/2006 | Rabenko et al. | |
| 7,167,112 B2 | 1/2007 | Andersen et al. | |
| 7,236,109 B1 | 6/2007 | Duewer et al. | |
| 7,262,716 B2 | 8/2007 | Yu et al. | |
| 7,474,722 B1 | 1/2009 | Chieng et al. | |
| 2002/0105448 A1 | 8/2002 | Friedhof | |
| 2002/0190880 A1 | 12/2002 | McLaughlin et al. | |
| 2003/0035064 A1 * | 2/2003 | Torikoshi et al. | 348/515 |
| 2003/0037297 A1 | 2/2003 | Araki | |
| 2003/0179116 A1 | 9/2003 | Oki | |
| 2004/0120361 A1 * | 6/2004 | Yu et al. | 370/545 |

* cited by examiner

STREAMING MULTI-CHANNEL AUDIO AS PACKETIZED DATA OR PARALLEL DATA WITH A SEPARATE INPUT FRAME SYNC

RELATED APPLICATIONS

This application claims priority to U.S. Provisional Patent Application No. 60/469,804, entitled "Streaming Multi-channel Audio as Packetized Data or Parallel Data with a Separate Input Frame Sync," by Andersen, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

1. Field of the Invention

The invention relates generally to audio amplification systems, and more particularly to systems and methods for converting data streams having a first sample rate to a second sample rate, wherein the input data streams are received in a packetized or bursty fashion.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

In a digital amplification system, audio data is usually transferred through a dedicated serial interface (SAI), SPDIF receiver, or DSP/host interface. An SAI interface provides a dedicated "LRCK" signal for frame synchronization and to indicate the sample rate. SPDIF data is biphase-mark encoded. Subframe and sample rate information may be recovered fairly easily by examining the preambles.

A DSP/host interface may, on the other hand, transmit data in a bursty manner, either as packetized data or as a straight FIFO write. To convey sample rate and channel information, time stamps and other information may be encoded in the packet header or such information may be passed in the commands, so that sample rate clock may be recovered by dedicated hardware clock recovery circuitry. One problem with this is that recovering the clock using time stamps and generating a low jitter clock from it is not a trivial design task.

SUMMARY OF THE INVENTION

One or more of the problems outlined above may be solved by the various embodiments of the invention. Broadly speaking, the invention comprises systems and methods for converting a data stream from a first sample rate to a second sample rate, wherein the data is not received in a steady stream at the input sample rate, but is instead received in bursts of data, such as packets of data.

One embodiment of the invention comprises a method including receiving bursty audio data on a first input line and receiving synchronization data on a second input line that is separate from the first input line. An input sample rate is then estimated for the received audio data based on the received synchronization data and the audio data is converted to an output sample rate. In one embodiment, the input sample rate is determined by counting a number of samples received in a time interval. This count may be low-pass filtered to reduce variations in the computed input sample rate. The audio data may be received as packetized data, parallel data, or various other forms of bursty data. The synchronization data may comprise individual signals corresponding to each sample of audio data, such as pulses or bits of data on the second input line. The synchronization data may be received at regular or irregular intervals. In one embodiment, the conversion of the audio data may comprise storing the received audio data in a buffer, upsampling the audio data to an intermediate sample rate and downsampling the audio data to the output sample rate.

An alternative embodiment of the invention comprises a system including an audio data interface configured to receive audio data in a bursty fashion and a synchronization data interface configured to receive a synchronization signal corresponding to the audio data. The system also includes a rate estimator configured to receive the synchronization signal and to generate an estimated input sample rate from the synchronization signal, a buffer configured to receive the audio data from the data interface and to temporarily store the audio data, and a sample rate converter configured to receive the estimated input sample rate and the audio data and to generate output audio data at an output sample rate. In one embodiment, the input sample rate is determined by counting a number of samples received in a time interval and potentially low-pass filtering the count. The audio data may be in packetized, parallel, or various other forms. The synchronization data may comprise individual signals, such as pulses or bits, and may be received at regular or irregular intervals. The sample rate converter may be configured to upsample the audio data to an intermediate sample rate and downsample the audio data to the output sample rate. The system may be implemented in various combinations of hardware and/or software.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for converting a digital input data stream that is received in a bursty fashion from a first sample rate to a second sample rate using a synchronization signal that may be separate from the audio data.

In one embodiment, the input data streams are received in a packetized or bursty fashion. In one embodiment, the burden is placed on the external DSP/host to provide an input sample rate clock or "frame sync" to the sample rate converter (SRC). The characteristics of the frame sync signal will be equivalent to an SAI LRCK signal. This could be 50% duty cycle, or single pulse, or some other variation. The frame sync is routed to the SRC rate estimator for input sample rate estimation. Packet/parallel data are transferred to the SRC input FIFO via various high speed interfaces such as ESSI or parallel Host Interface. The SRC then does the input rate estimation and processes the data accordingly.

It is up to the DSP/host to transmit frame information or to guarantee channel ordering in the packets to ensure deterministic channel data ordering. This may be configurable in software.

A preferred embodiment of the invention is implemented in an audio amplification system. As noted above, pulse width modulation (PWM) technology has recently been applied in audio amplification systems, but has suffered from the drawbacks of conventional methodologies. These methodologies employ analog modulation schemes which are very complex and costly, and which provide relatively poor performance. The present systems and methods are instead implemented in digital modulation schemes and employ methodologies which overcome some of the problems that existed in the prior art.

Figure 1:
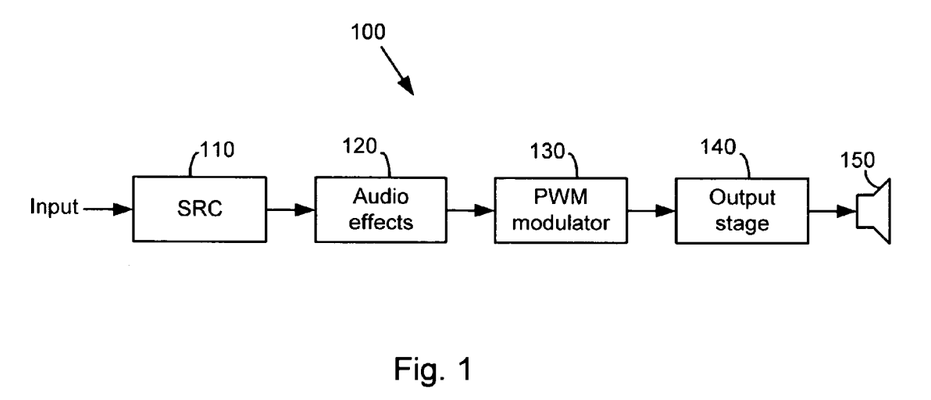
FIG. 1 is a functional block diagram illustrating a digital audio amplification system using PWM technology.

Referring to FIG. 1, a functional block diagram illustrating a digital audio amplification system using PWM technology is shown. In this embodiment, system 100 receives a digital input data stream from a data source. While the data source in some digital amplifiers comprises a device such as a CD player, MP3 player, digital audio tape, or the like, this embodiment of the invention receives the digital input data stream from a bursty source, such as a packet-based network.

As used herein, "bursty" means irregular. Thus, digital audio data that is bursty is not received at a constant frame rate, but is instead received in bursts. For example, if the data is received in packets transmitted over a network, one packet containing several frames of data may be received, then no data may be received for several frame intervals, then another packet containing several more frames of data may be received.

The input data stream is received by sample rate converter 110. The input data stream has a particular sample rate which depends upon the data source. This sample rate is typically one of a set of predetermined sample rates that are used by the corresponding type of device. For example, a CD player may output digital data with a sample rate of 44.1 kHz, while a digital audio tape player may output data with a sample rate of 32 kHz.

In the present systems and methods, sample rate converter 110 converts the input data stream from the sample rate at which it was received to a predetermined internal rate which is used within system 100. In one embodiment, this internal sample rate is 100 kHz. Thus, if data is received at a sample rate of 50 kHz, sample rate converter 110 will re-sample the data to produce a corresponding internal data stream at a sample rate of 100 kHz. This internal data stream is then provided to an audio effects subsystem 120. Audio effects subsystem 120 performs any desired processing on the internal data stream and provides the resulting processed data stream to PWM modulator 130.

The data stream received by PWM modulator 130 represents a pulse code modulated signal. PWM modulator 130 converts this data stream to a pulse width modulated signal. The pulse width modulated signal is then provided to output stage 140. Output stage 140 amplifies the pulse width modulated signal and may perform some filtering or further processing of the amplified signal. The resulting signal is then output to a speaker system 150, which converts the electrical signal to an audible signal which can be heard by a listener.

Figure 5:
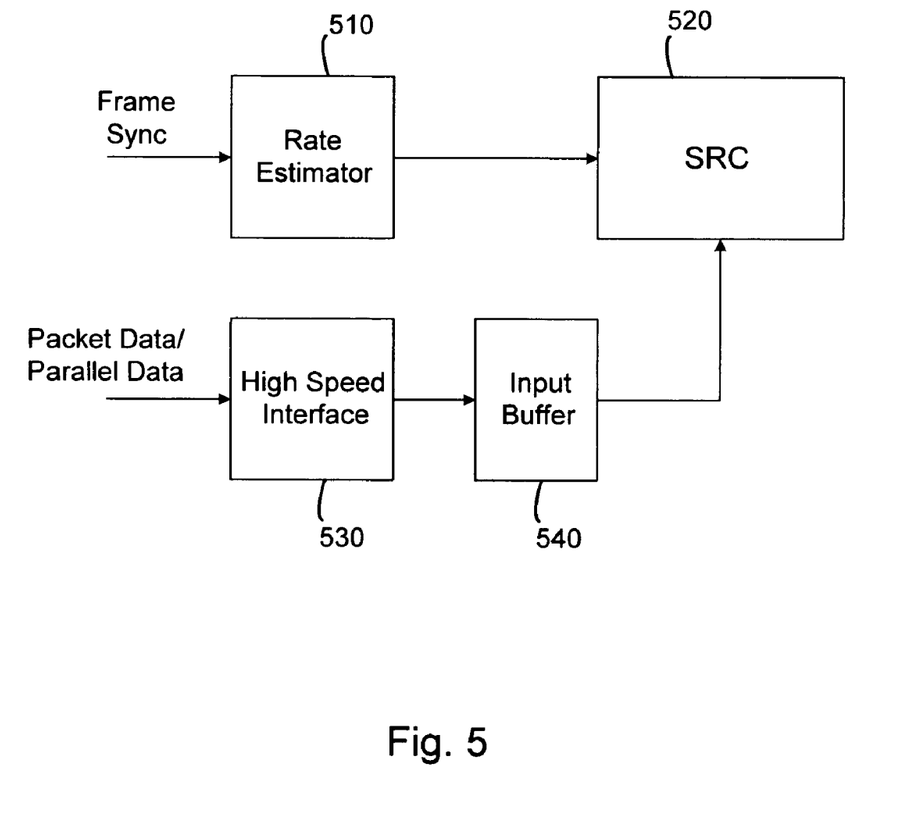
FIG. 5 is a diagram illustrating the receipt of frame sync information separate from the packetized or bursty data in accordance with one embodiment.

Referring to FIG. 5, a functional block diagram illustrating the rate estimation mechanism of one embodiment is shown. In this figure, the frame sync signal is received separately from the data. The frame sync signal is received by rate estimator 510, and a corresponding rate estimate is forwarded to sample rate converter 520. The data itself is received at high-speed interface 530 in the form of packets or bursts of data and is forwarded to input buffer 540. The data is read out of the buffer at the rate determined by the rate estimator and is forwarded to the sample rate converter. The data can then be sample-rate-converted in the manner described in more detail below.

In this embodiment, rate estimator 510, data interface 530 and buffer 540 are depicted as being separate from sample rate converter 520. It should be noted that, in other embodiments, the rate estimator, data interface and buffer may be incorporated into the sample rate converter.

The frame sync signal provided to rate estimator 510 may have any of a variety of forms, but will generally be equivalent to an SAI LRCK signal. For instance, the frame sync signal could have a 50% duty cycle, or it might be a single pulse, or it might be some other variation. In one embodiment, rate estimator 510 low-pass filters the output of the rate estimator to minimize jitter that may be present in the signal. In one embodiment, the filtering of the frame sync signal may even compensate for irregularities in the frame sync signal that are greater than what might be considered "jitter." Thus, if the frame sync signal is averaged over a long enough interval, the frame sync signal itself may be bursty. Generally speaking, however, this is very impractical, so in a preferred embodiment the frame sync signal should not be bursty.

As noted above, the digital audio data received by data interface 530 is bursty. The data may, for instance, be packetized data (where the data is encapsulated in packets) or it may be parallel data. Data interface 530 is typically a high-speed data interface. For example, data interface 530 may be one of a number of high speed interfaces such as ESSI or parallel Host Interface. When bursty data is received by data interface 530, it is transferred to buffer 540.

As explained above, the purpose of the sample rate converter is to receive an input data stream which is sampled at a first rate, and to generate an output data stream which is sampled at a second rate. While the audio signal which is represented by the data stream remains essentially unchanged (at least in some embodiments), the sampling rate is changed to conform to the requirements of the audio system so that it can be processed by the system.

Figure 2:
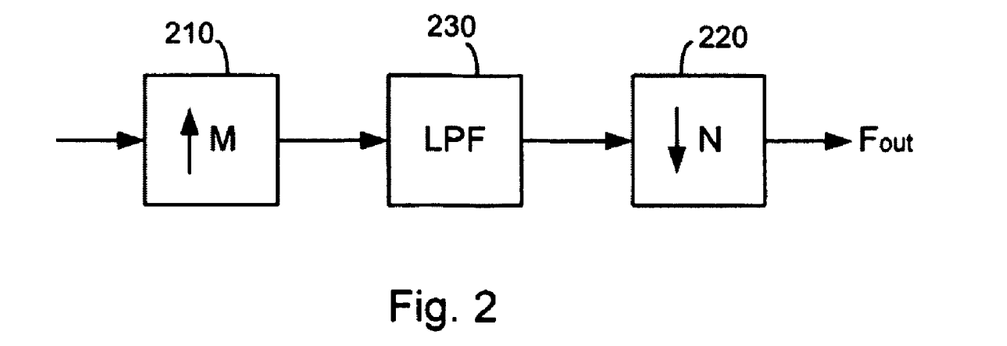
FIG. 2 is a diagram illustrating the manner in which sample rate conversion is typically performed.

Referring to FIG. 2, a diagram illustrating the manner in which sample rate conversion is typically performed is shown. As depicted by this figure, an input data stream is first up-sampled, or interpolated, by a first filter 210, and is down-sampled, or decimated, by a second filter 220. An intermediate filter 230 is used to low-pass filter the up-sampled data before it is decimated. The input data stream has a first sample rate, Fin. This data stream is up-sampled by a factor of M. Thus, after up-sampling, the data stream has a sample rate of M×Fin. The up-sampling is typically achieved by interpolating between the samples of the input data stream to generate intermediate samples. M is chosen so that the intermediate sample rate (M×Fin) is higher than the desired output sample rate, Fout. Typically, the intermediate rate is much higher than the desired output rate.

The up-sampled data stream is low-pass filtered and then decimated to reduce the sample rate from the intermediate rate to the desired output rate. After down-sampling, the sample rate is Fout=(M/N)×Fin. The down-sampling, or decimation, of the data stream is typically accomplished by dropping samples from the intermediate data stream. For example, if the intermediate data stream is sampled at 200 kHz and the desired output sample rate is 100 kHz, every other sample will be dropped.

Ideally, M and N are integers. If M is an integer, the up-sampling of the input data stream comprises inserting M−1 new samples, evenly spaced between each of the original samples. Then, if N is an integer, the down-sampling of the intermediate data stream comprises taking only every Nth sample and dropping the rest. This is illustrated in FIG. 3.

Figure 3:
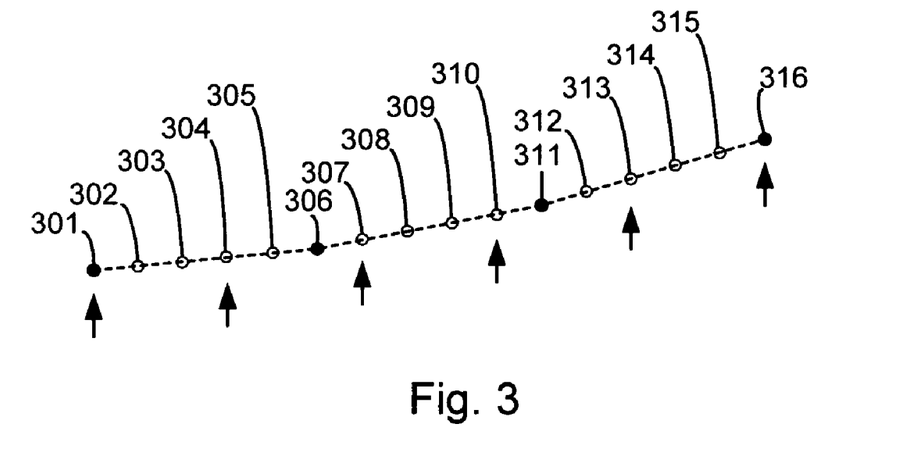
FIG. 3 is a diagram illustrating the interpolation and decimation of a sampled input signal to produce a corresponding signal at a different sample rate.

FIG. 3 is a diagram illustrating the interpolation and decimation of a sampled input signal to produce a corresponding signal at a different sample rate. In this figure, the input samples are represented by points 301, 306, 311 and 316. The straight-line interpolated value of the signal is represented by the dotted lines. (It should be noted that other embodiments may use other interpolation methods, such as higher-order curve fitting algorithms.) The signal is up-sampled by a factor of 5, so 4 additional sample points are interpolated between each pair of adjacent samples. Thus, points 302-305 are inserted in the interval between sample 301 and sample 306. Likewise, points 307-310 are inserted between samples 306 and 311, and points 312-315 are inserted between samples 311 and 316. After being low-pass filtered, the resulting points (301-316) are down-sampled by a factor of 3, so every third point is used, and the remainder are discarded. The resulting data stream consists of samples 301, 304, 307, 310, 313 and 316 (as indicated by the arrows).

One of the problems with a straightforward implementation of the up-sampling and down-sampling of the input data stream is that, in order to make M and N integers, and in order to maintain the desired resolution, M and N typically must be very large numbers. Consider the example of FIG. 3. If $F_{in}$ is 60 kHz and $F_{out}$ is 100 kHz, M is 5 and N is 3. If $F_{in}$ were 60.5 kHz instead of 60 kHz, however it would be necessary to select M=200 and N=121. Scenarios requiring even higher values for M and N can easily be developed. Based upon the resolution of the sample rate converter in the preferred embodiment, values of up to $2^{18}$ might be necessary.

Another problem with the interpolation-and-decimation methodology is that it may be difficult to handle variations in the sample rates of the received data streams. In typical audio systems, each device or component may generate its own clock signal upon which the corresponding sample rate is based. Even if the clock signals for two components are intended to be identical, however, the clock signals are not synchronized and may have slight variations. As a result of the differences in clock signals, data may be dropped, or buffers may overflow, resulting in errors. The present sample rate converter is designed to handle these differences.

It should be noted that audio systems may also include various different types of audio sources. For example, the audio signal may be generated by a CD player, MP3 player, digital audio tape or the like. These devices may be configured to generate audio signals at different sample rates. For instance, a CD player may provide an output signal that has a 44.1 kHz sample rate, while a digital audio tape player may generate an output signal at a 32 kHz sample rate. The present systems and methods enable the sample rate converter to accommodate multiple different sample rates in the input data stream. Moreover, the sample rate converter is capable of independently adjusting each channel to accommodate a different input sample rate. By comparison, prior art systems can only accommodate different sample rates on different channels if the two sample rates are known.

The accommodation of different sample rates, and variations between rates that are nominally the same, may be achieved through the use of a polyphase filter. The polyphase filter performs the functions of both interpolator 210 and decimator 220. The polyphase filter performs these functions by interpolating the input data stream in a manner which does not require that the data stream be up-sampled by an integer factor or down-sampled by an integer factor.

The interpolator and the decimator described above are typically implemented as (FIR-type) filters. The polyphase filter is obviously also a filter, but rather than generating a large number of samples (as performed by the interpolation filter) and then throwing away unneeded samples and (as performed by the decimation filter), the polyphase filter generates only those samples that will, in the end, be retained. Thus, compared to the example of FIG. 3, rather than generating samples 301-316 and then discarding two-thirds of these samples, only samples 301, 304, 307, 310, 313 and 316 are generated, and none are discarded.

The polyphase filter is defined by a set of filter coefficients. If the coefficients are extrapolated to a different set of coefficients, different sampling rates are achieved. This enables non-integer sample rate conversion through the choice of appropriate filter coefficients.

Figure 4:
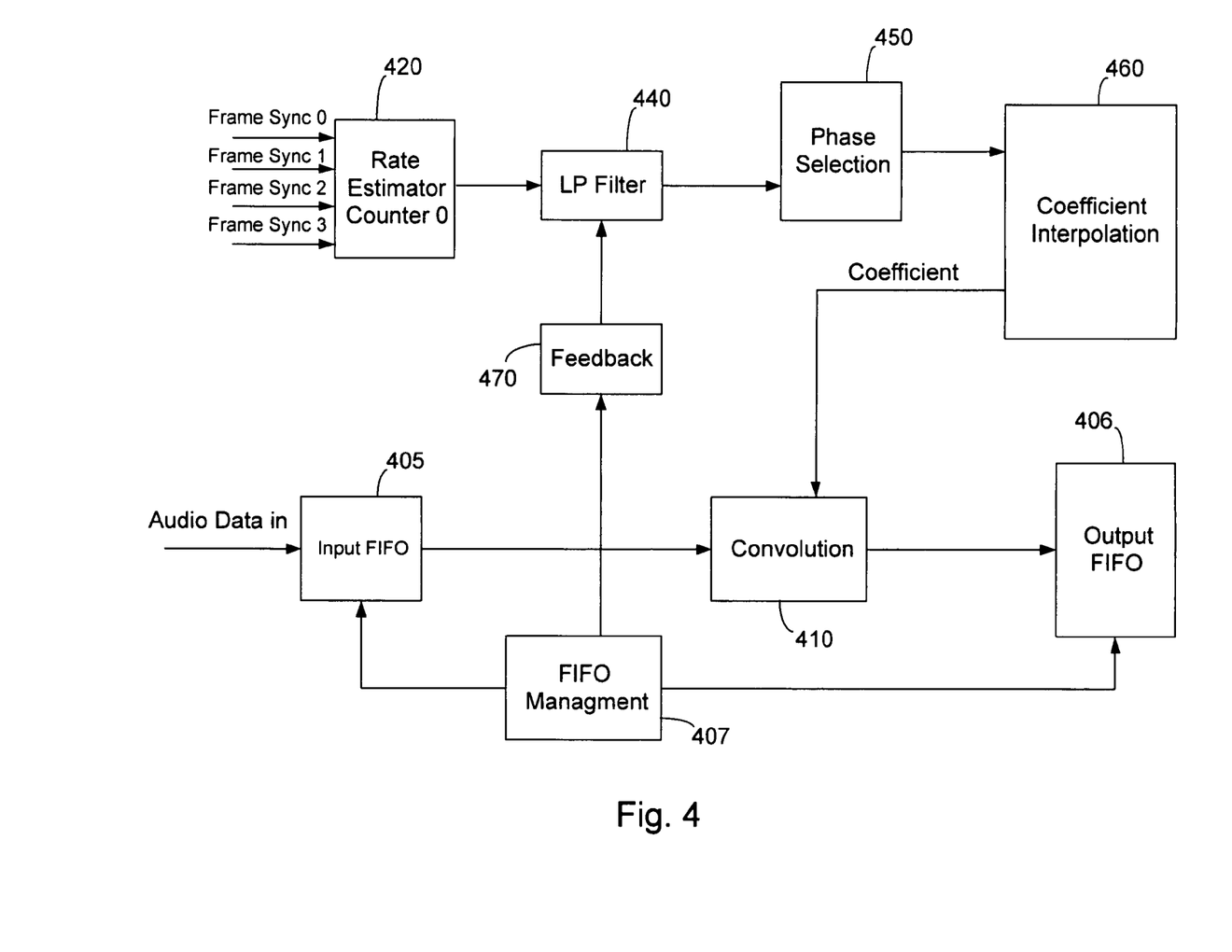
FIG. 4 is a diagram illustrating the components of a sample rate converter in accordance with one embodiment of the invention.

Referring to FIG. 4, a diagram illustrating the components of a sample rate converter in accordance with one embodiment of the invention is shown. The lower half of the figure generally corresponds to a data path for the audio data that will be converted, while the upper half of the figure corresponds to a control path for controlling the actual sample rate conversion. The control path includes the interpolator and the filter coefficient memory.

As shown in FIG. 4, samples of an audio data stream are received and stored in an input FIFO 405. The input data stream has a sample rate of $F_{in}$. The samples are read from FIFO 405 and convolved with a set of interpolated coefficients by convolution engine 410. Convolution engine 410 effectively up-samples or down-samples the data to produce samples at a rate equivalent to the output rate ($F_{out}$) of the sample rate converter. These samples are stored in an output FIFO 406. The samples are then read out of output FIFO 406 at rate $F_{out}$.

Frame sync signals associated with the audio data are received by a rate estimator counter 420. Rate estimator counter 420 simply counts the number of clock cycles between consecutively received samples. (It should be noted that, while the present embodiment has only one channel, other embodiments may handle N channels and have N corresponding sets of components.) The count output by the rate estimator counter is filtered by low pass filter 440. The filtered sample rate count is forwarded to phase selection unit 450, and is used to interpolate the filter coefficients for the polyphase filter. The interpolated polyphase filter coefficients are then convolved with the data samples in convolution unit 410 to produce the re-sampled data.

Referring to FIG. 5, the rate estimation mechanism of one embodiment is shown. In this figure, a frame sync signal is received separately from the corresponding audio data. The frame sync signal is received by the rate estimator, and a corresponding rate estimate is forwarded to the sample rate converter. The audio data itself is received in this embodiment at a high-speed interface and is forwarded to an input buffer. The data is read out of the buffer at the rate determined by the rate estimator and is forwarded to the sample rate converter.

In this embodiment, the synchronization and audio data are expected to be received in a bursty fashion. That is, the data is not expected to be received at a constant rate, but is instead expected to be received in bursts. This type of data delivery is typical of packet-oriented environments such as ethernet networks. Thus, several milliseconds of data may be received in a burst of packets over an interval that covers less than a millisecond. The system must therefore be able to buffer this data and read the data out of the buffer at the appropriate rate to reconstruct the audio signal. As noted above, this is accomplished by buffering the audio data, determining the sample rate from a separately received synchronization signal, and reading the audio data out of the buffer according to the computed sample rate.

This method of handling the audio data is in sharp contrast with conventional means for handling audio data. Usually, the audio data is received at a constant rate, synchronized with a frame synchronization signal (e.g., as in a serial audio interface, SAI, or Sony/Philips Digital Interface, SPDIF). If the audio data is not received in a constant stream (e.g., the audio data is delivered in packets), it is conventionally necessary to provide timestamps within the packets in order to be able to reconstruct the timing of the received audio data. Using the present systems and methods, it is possible to eliminate the need to have to either a constant stream of audio data or timestamp information within the packets of data.

It should be noted that the bursty audio data may be delivered in the present systems and methods by various means. In one embodiment, the data may be delivered in packets (e.g., as in audio-over-ethernet). In another embodiment, the data may be delivered without first being packetized, but may nevertheless be delivered in bursts. The data may be delivered as parallel or serial data. Still other variations in the type of received idea data may also be possible.

It should be noted that the synchronization signal may also vary from one embodiment to another. In one embodiment, the synchronization signal may comprise a simple signal that is momentarily asserted (e.g., a short pulse or a bit) corresponding to each frame of audio data. In other words, before every frame of audio data, the synchronization signal may include a corresponding 1-bit. In another embodiment, the synchronization signal may be more complex. For example, a packet may be transmitted corresponding to each packet of audio data. Each synchronization packet may simply identify the number of frames of audio data in a corresponding audio data packet, or it may provide additional information as well. Still other variations are possible.

In one embodiment, the synchronization data may be low-pass filtered before it is used to determine the sample rate. For instance, if bits of a synchronization signal are received in bursts, the output of a rate estimator based on the synchronization signal may be low-pass filtered to reduce fluctuations in the frame rate that is indicated by the bits. In other words, rather than determining the instantaneous rate at which the synchronization bits are received, the rate may be averaged over a predetermined interval in order to reduce the effect of having received in the synchronization information in bursts.

Referring again to FIG. 4, the flow of data samples in the sample rate converter is through FIFO 405 and FIFO 406. This data flow is managed by FIFO management unit 407, based on the flow of data, FIFO management unit 407 provides feedback to feedback unit 470. This feedback is used to adjust low pass filter 440. Effectively, this adjusts the sample rate which is estimated and thereby adjusts the coefficient interpolation performed in the sample rate converter. The sample rate conversion is thereby also adjusted to more closely track the actual input sample rate and to prevent the overflow or underflow of FIFOs 405 and 406.

In one embodiment, rate estimator counter 420 is a 24-bit counter that can select from four input frame sync signals: SAI LRCK; SPDIF RX frame sync; Packet Data frame sync; and ESSI frame sync. The period measurement is accomplished by counting the number of DSP clock cycles between frame sync signals. In this embodiment, the count is multiplied by a value that is equivalent to a gain. The gain value is a 12-bit integer which is typically set to a power of 2, which is equivalent to a 1-bit left shift which creates an additional bit of resolution.

Low pass filter 440 is, in one embodiment, a second-order IIR filter. This filter may, for example, comprise a pair of cascaded first-order IIR filters. Low pass filter 440 attenuates jitter in the count received from the rate estimator counter. This ensures that the count changes slowly, and thereby improves the quality of the sample rate conversion. The averaging process that is implemented by the low pass filter causes the potential for buffer underflow or overflow. This problem is corrected by implementing closed loop feedback in the software which adjusts a 24-bit offset that is added to the count value before the value is passed through low pass filter 440. In one embodiment, the filter coefficient of low pass filter 440 is adjustable to allow faster frequency and phase lock.

Coefficient interpolator 460 works in conjunction with the ROM in which the coefficients are stored and the ROM address generator that provides addresses for retrieval of the coefficients for use by the interpolator. The filter coefficients are actually stored in two ROMs—one stores even coefficients, while the other stores odd coefficients. The interpolator performs a cubic spline interpolation. The interpolator employs a five-stage, two-cycle pipeline to perform the interpolation, thereby enabling resource sharing while maintaining a throughput of one interpolation per two clock cycles.

In one embodiment, the software of the sample rate converter is responsible for performing a number of tasks. For example, as mentioned above, rate estimator counter 420 multiplies its counter values by a gain, but the gain is determined by the software. Similarly, the offset and filter coefficients for the low pass filter following the rate estimator counter are determined by the software. The software is further responsible for calculating the ratio of the input sample rate ($F_{in}$) to the output sample rate ($F_{out}$). Based upon the ratio of sample rates and the filtered counter values, the software determines the filter length, phase and phase increment for interpolation of the polyphase filter coefficients. Further, the software is responsible for convolving the polyphase filter coefficients with the input samples, managing the input and output FIFOs, and providing feedback for adjustment of the estimated input sample rate.

The software components are implemented in a data processor. Typical modern processors have the capability of executing tight loops very efficiently while reading in data streams. For example, digital signal processors (DSP's) have "zero overhead looping" capability. Modern microcontrollers also have the capability of executing multiple instructions per cycle. These DSP's and microcontrollers typically also have separate program and data memories that make them suitable for sample rate converter applications.

These processors have the capability, for example, to execute the following in one processor cycle: read a data sample from memory (as indicated by a sample pointer register); update the sample pointer register to point to a next sample; multiply the data sample by a coefficient value; and add (accumulate) the result of the multiplication in a data register. If the polyphase filter contains X coefficients, X clock cycles are used to compute one output sample.

Aside from the functions mentioned above, the sample rate converter is responsible for reading and interpolating the polyphase filter coefficients. A processor can handle a number of parallel channels Y at the same time, where Y is limited by the available number of accumulator and sample pointer registers. When Y channels are processed simultaneously using identical coefficients, relatively compact hardware can be designed to perform the following in Y or less cycles: read a number of coefficients from memory (as indicated by coefficient pointer); update a coefficient pointer register; and perform interpolation to calculate filter coefficients to a desired precision.

In "pseudo C" the processor would do the following:
for every output sample
  Initialize the hardware coefficient calculator
  for j=1 to Y
    o[Y]=0; //Initialize accumulators
    p[Y]=start(N); //Initialize pointers
  for i=1 to X //For every coefficient
    C=mem[coeff] //Read coefficient
    for j=1 to Y //For every channel
      o[Y]+=C*mem[p[Y]++]

Typically, the inner loop using j would be unrolled, and reading the next coefficient would be done in parallel with the last iteration (j=Y). A simple and efficient processor would calculate a new coefficient for every Y cycles. A more flexible solution would calculate a coefficient in Y or fewer cycles. When a new sample becomes available, the processor will halt computations until this sample is read and thereby automatically adjust to the rate at which the DSP reads the filter coefficients. Besides making the actual value of Y more flexible, this also allows the processor to periodically halt the computations and service other functions like interrupts.

In some embodiments, components of the sample rate converter may be shared between two or more independent sample rate conversion paths. For instance, two different paths may both use the same interpolator hardware.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method comprising:
   receiving bursty audio data comprising samples on a first input line, wherein at least some of the samples of the bursty audio data are received at irregular intervals;
   storing samples of the bursty audio data in an input buffer;
   receiving synchronization data on a second input line that is separate from the first input line;
   estimating an input sample rate for the received bursty audio data based on the received synchronization data; and
   outputting samples of the bursty audio data from the input buffer;
   convolving samples of the burst audio data that are output from the input buffer with polyphase filter coefficients that are generated in dependence on the estimated input sample rate;
   receiving, at an output buffer, samples of the bursty audio data that have been convolved with the polyphase filter coefficients;
   reading samples of the bursty audio data that have been convolved with the polyphase filter coefficients out of the output buffer at a predetermined output sample rate;
   managing a flow of samples of the bursty audio data through the input buffer and samples of the bursty audio data that have been convolved with the polyphase filter coefficients through the output buffer to prevent overflow and/or underflow of the input and output buffers; and
   adjusting the estimated input sample rate in dependence on the flow of samples of the bursty audio data through the input buffer and samples of the bursty audio data that have been convolved with the polyphase filter coefficients through the output buffer.

2. The method of claim 1, wherein estimating the input sample rate comprises determining a number of samples of the bursty audio data received in a time interval.

3. The method of claim 1, further comprising low-pass filtering the estimated input sample rate.

4. The method of claim 1, wherein receiving bursty audio data comprises receiving packetized data.

5. The method of claim 1, wherein receiving bursty audio data comprises receiving parallel data.

6. The method of claim 1, wherein receiving synchronization data comprises receiving a separate synchronization signal corresponding to each sample of the bursty audio data.

7. The method of claim 6, wherein receiving synchronization data comprises receiving a pulse corresponding to each sample of the bursty audio data.

8. The method of claim 1, wherein the method is implemented in a digital audio amplification system.

9. The method of claim 1, wherein storing the bursty audio data in the input buffer occurs prior to any changing of a sample rate of the bursty audio data, and also prior to any filtering of the bursty audio data.

10. A system comprising:
   an audio data interface configured to receive bursty audio data comprising samples;
   a synchronization data interface configured to receive a synchronization signal corresponding to the bursty audio data;
   a rate estimator configured to receive the synchronization signal and to generate an estimated input sample rate for the received bursty audio data from the synchronization signal;
   an input buffer configured to receive samples of the bursty audio data from the data interface, store samples of the bursty audio data, and output samples of the bursty audio data;
   a convolution engine configured to convolve samples of the bursty audio data that are output from the input buffer with polyphase filter coefficients that are generated in dependence on the estimated input sample rate;
   an output buffer configured to receive samples of the bursty audio data that have been convolved with the polyphase filter coefficients; and
   a buffer management unit configured to manage a flow of samples of the bursty audio data through the input buffer and samples of the bursty audio data that have been convolved with the polyphase filter coefficients through the output buffer to prevent overflow and/or underflow of the input and output buffers;
   wherein the estimated input sample rate generated by the rate estimator is adjusted based on the flow of samples of the bursty audio data through the input buffer and samples of the bursty audio data that have been convolved with the polyphase filter coefficients through the output buffer; and
   wherein samples of the bursty audio data that have been convolved with the polyphase filter coefficients through the are read out of the output buffer at a predetermined output sample rate.

11. The system of claim 10, wherein the rate estimator is configured to generate the estimated input sample rate by counting a number of samples of the bursty audio data received in a predetermined interval.

12. The system of claim 11, wherein the rate estimator is further configured to low-pass filter the number of samples of the bursty audio data received in the predetermined interval.

13. The system of claim 10, wherein the audio data interface is configured to receive the bursty audio data in packetized form.

14. The system of claim 10, wherein the audio data interface is configured to receive the bursty audio data as parallel data.

15. The system of claim 10, wherein the synchronization data interface is configured to receive synchronization data as a plurality of signals, wherein each signal corresponds to a single sample of the bursty audio data.

16. The system of claim 15, wherein the synchronization data interface is configured to receive the plurality of signals as pulses.

17. The system of claim 10, wherein the system is implemented in a digital audio amplification system.

18. The system of claim 10, wherein the input buffer is configured to receive the bursty audio data from the data interface and to store the bursty audio data prior to any filtering of the bursty audio data.

19. The system of claim 18, wherein the input buffer comprises a FIFO.

20. The system of claim 10, wherein the input buffer comprises a FIFO.

* * * * *